(12) United States Patent
Gunji

(10) Patent No.: US 10,581,031 B2
(45) Date of Patent: Mar. 3, 2020

(54) ORGANIC EL DISPLAY DEVICE

(71) Applicant: Japan Display Inc., Tokyo (JP)

(72) Inventor: Masakazu Gunji, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/203,747

(22) Filed: Nov. 29, 2018

(65) Prior Publication Data

US 2019/0189974 A1 Jun. 20, 2019

(30) Foreign Application Priority Data

Dec. 14, 2017 (JP) ................................ 2017-239363

(51) Int. Cl.
| | | |
|---|---|---|
| H01L 51/56 | (2006.01) | |
| G09G 3/3233 | (2016.01) | |
| H01L 51/52 | (2006.01) | |
| H01L 27/32 | (2006.01) | |

(52) U.S. Cl.
CPC .......... *H01L 51/56* (2013.01); *G09G 3/3233* (2013.01); *H01L 27/3246* (2013.01); *H01L 27/3258* (2013.01); *H01L 27/3265* (2013.01); *H01L 27/3276* (2013.01); *H01L 51/5206* (2013.01); *H01L 51/5221* (2013.01)

(58) Field of Classification Search
CPC . H01L 51/56; H01L 51/5206; H01L 51/5221; H01L 27/3258; H01L 27/3265; H01L 27/3246; H01L 27/3276; G09G 3/3233
USPC ..... 257/40, 43, 59, 72, 89, 93, 99, E51.018, 257/E33.053, E27.111; 313/498, 506; 315/158; 438/23, 27, 34
See application file for complete search history.

(56) References Cited

U.S. PATENT DOCUMENTS

| | | | | |
|---|---|---|---|---|
| 9,964,799 | B2* | 5/2018 | Hirakata | ........... G02F 1/133553 |
| 2013/0112975 | A1* | 5/2013 | Choi | .................... H01L 27/1248 |
| | | | | 257/59 |
| 2015/0014681 | A1* | 1/2015 | Yamazaki | ........... H01L 27/1218 |
| | | | | 257/43 |
| 2015/0179724 | A1* | 6/2015 | Lee | ..................... H01L 27/3241 |
| | | | | 257/40 |
| 2016/0133681 | A1* | 5/2016 | Nam | ................... H01L 51/5265 |
| 2018/0090068 | A1* | 3/2018 | Ogawa | ................. G09G 3/3233 |

FOREIGN PATENT DOCUMENTS

JP 2008-051990 A 3/2008

* cited by examiner

*Primary Examiner* — Dao H Nguyen
(74) *Attorney, Agent, or Firm* — Michael Best & Friedrich LLP

(57) ABSTRACT

An organic EL display device includes a thin film transistor; a first insulating layer covering the thin film transistor; a first conductive layer on the first insulating layer; a second insulating layer on the first conductive layer; a second conductive layer on the second insulating layer; a pixel capacitor formed of the first conductive layer, the second insulating layer and the second conductive layer; a third insulating layer provided on the second conductive layer and including an opening in a region overlapping a part of the second conductive layer as seen in a plan view; and an organic layer covering the opening of the third insulating layer and including a light emitting layer. The first insulating layer includes a first groove in a region overlapping the third insulating layer as seen in a plan view, and a part of the pixel capacitor is located inside the first groove.

20 Claims, 18 Drawing Sheets ial EL DISPLAY DEVICE

CROSS REFERENCE TO RELATED APPLICATIONS

This application is based on and claims the benefit of priority from the prior Japanese Patent Application No. 2017-239363, filed on Dec. 14, 2017, the entire contents of which are incorporated herein by reference.

FIELD

The present invention relates to an organic EL (electroluminescence) display device including an organic EL element as a light emitting element.

BACKGROUND

Recently, more and more products such as mobile information terminals and the like use an organic EL display device for a display screen. An organic EL display device is a display device of a self-light emission type that controls a plurality of pixels, each including a light emitting element, to form an image, and has an advantage of being low in the viewing angle dependence. Each of the pixels of the organic EL display device includes a switching transistor usable to write a video signal and a driving transistor usable to control an electric current flowing to the light emitting element.

A gate terminal of the driving transistor is connected with an output terminal (source or drain) of the switching transistor. With such a structure, a video signal that is input to the gate terminal of the driving transistor is controlled by an on/off operation of the switching transistor. In general, a pixel capacitor acting as a passive element that accumulates charges is connected between the gate terminal of the driving transistor and the output terminal of the switching transistor. The voltage of the pixel capacitor is applied to the gate terminal of the driving transistor, and an electric current in accordance with the voltage flows to the light emitting element (see, for example, Japanese Laid-Open Patent Publication No. 2008-51990).

SUMMARY

An organic EL display device in an embodiment according to the present invention includes a thin film transistor; a first insulating layer covering the thin film transistor; a first conductive layer on the first insulating layer; a second insulating layer on the first conductive layer; a second conductive layer on the second insulating layer; a pixel capacitor formed of the first conductive layer, the second insulating layer and the second conductive layer; a third insulating layer provided on the second conductive layer and including an opening in a region overlapping a part of the second conductive layer as seen in a plan view; and an organic layer covering the opening of the third insulating layer and including a light emitting layer. The first insulating layer includes a first groove in a region overlapping the third insulating layer as seen in a plan view, and a part of the pixel capacitor is located inside the first groove.

DESCRIPTION OF EMBODIMENTS

Figure 1:
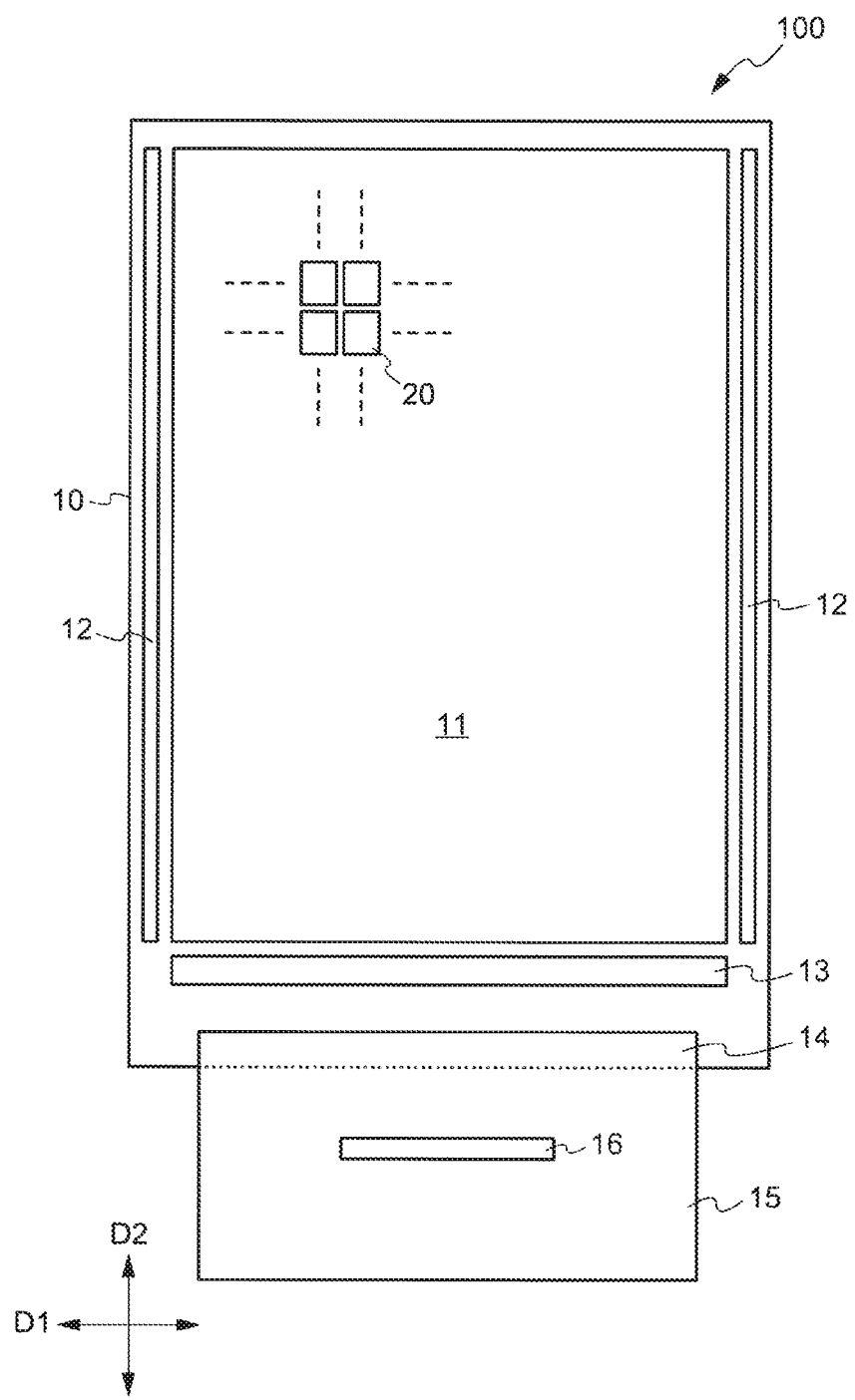
FIG. 1 is a plan view showing a structure of an organic EL display device in embodiment 1.

The above-described pixel capacitor is formed by stacking parts of thin films included in the pixel. For example, a pair of conductive layers may be located to face each other with an insulating layer being provided between the pair of conductive layers, so that a capacitor acting as the pixel capacitor is formed. Recently, as the display device becomes of higher definition, the area size of the pixel is decreased. Thus, it is becoming more and more difficult to form a pixel capacitor having a sufficient capacitance in the pixel.

One object of an embodiment of the present invention is to provide an organic EL display device including a pixel capacitor having a sufficient capacitance with certainty in a small space of a pixel.

Hereinafter, embodiments of the present invention will be described with reference to the drawings and the like. The present invention may be carried out in various forms without departing from the gist thereof, and is not to be construed as being limited to any of the following embodiments. In the drawings, components may be shown schematically regarding the width, thickness, shape and the like, instead of being shown in accordance with the actual sizes, for the sake of clearer illustration. The schematic drawings are merely examples and do not limit the interpretations of the present invention in any way. In the specification and the drawings, components that have substantially the same functions as those described before with reference to a previous drawing(s) bear the identical reference signs thereto, and detailed descriptions thereof may be omitted.

In the specification and the claims, the terms "on", "above", "upward", "below", "downward" and the like each represent a relative positional relationship between the component of interest and another component with respect to a surface of a substrate on which a light emitting element is formed (hereinafter, referred to simply as a "surface"). For example, in this specification, a direction from the surface of the substrate toward the light emitting element is represented by the term "on", "above" or "upward", and an opposite direction thereto is represented by "below" or "downward. In the specification and the claims, an expression that a component is "on" another component encompasses a case where such a component is in contact with the another component and also a case where such a component is above or below the another component, namely, a case where still another component is provided between such a component and the another component, unless otherwise specified.

In the case where a thin film formed on a substrate is processed to form a plurality of thin film patterns, these thin film patterns may have different functions or roles. However, the plurality of thin film patterns are formed of the thin film formed in the same step, and are formed of the same material or have the same layer structure. Therefore, the plurality of thin film patterns are defined as being present in the same layer.

Embodiment 1

<Structure of the Display Device>

FIG. 1 is a plan view showing a structure of an organic EL display device 100 in embodiment 1. As shown in FIG. 1, an array substrate 10 includes a pixel portion 11, a scanning line driving circuit 12, a video signal line driving circuit 13, and a terminal portion 14. The array substrate 10 includes a support substrate 101 (see FIG. 2) and thin films stacked on the support substrate 101. The thin films are formed into various circuits and an organic EL element 70 (see FIG. 2). The array substrate 10 is also referred to as an "active matrix substrate". The terminal portion 14 is electrically connected with a flexible printed circuit board 15. In this embodiment, the flexible printed circuit board 15 has an integrated circuit 16 mounted thereon. The integrated circuit 16 transmits various signals to the scanning line driving circuit 12 and the video signal line driving circuit 13.

The pixel portion 11 includes a plurality of pixels 20 each including the organic EL element 70. Specifically, the pixels 20 are arrayed in a D1 direction (row direction) and a D2 direction (column direction) shown in FIG. 1, and are arrayed in a matrix as a whole. A detailed structure of the pixels 20 will be described below.

The scanning line driving circuit 12 is a driving circuit that supplies a gate signal to scanning lines (gate lines) located in the pixel portion 11. In this embodiment, the scanning line driving circuit 12 is provided along both of two sides of the pixel portion 11. With such a structure, a gate signal is supplied from the left side and the right side of the pixel portion 11. The scanning line driving circuit 12 includes, for example, a shift register circuit.

The video signal line driving circuit 13 is a driving circuit that supplies a video signal to video signal lines (data signal lines) located in the pixel portion 11. In this embodiment, the video signal line driving circuit 13 includes an analog switch circuit and a shift register circuit. The video signal line driving circuit 13 is not limited to this. For example, the video signal line driving circuit 13 may include a circuit that convers an analog video signal into a gray scale voltage.

The terminal portion 14 includes terminals that supply a signal to a plurality of lines extending from the scanning line driving circuit 12 and the video signal line driving circuit 13. The plurality of lines are located in the terminal portion 14, and ends of the lines respectively form the terminals. The flexible printed circuit board 15 is electrically connected with the terminals. A signal transmitted from the integrated circuit 16 via the flexible printed circuit board 15 (e.g., clock signal, video signal, etc.) is transmitted to the scanning line driving circuit 12 and the video signal line driving circuit 13 via the plurality of lines extending from the terminal portion 14.

As described above, in this embodiment, the integrated circuit 16, transmitting various signal to the scanning line driving circuit 12 and the video signal line driving circuit 13, is mounted on the flexible printed circuit board 15. The integrated circuit 16 has a role of transmitting a control signal such as a clock signal, a start pulse or the like to the scanning line driving circuit 12, or a performing a predetermined signal process on the video signal. In this embodiment, the integrated circuit 16 is mounted on the flexible printed circuit board 15. Alternatively, the integrated circuit 16 may be directly mounted on the support substrate 15 (see FIG. 2).

Now, a structure of the pixels 20 of the organic EL display device 100 in this embodiment will be described. The pixels 20 shown in FIG. 1 actually include three sub pixels corresponding to the three colors of RGB. In this specification, one sub pixel will be described as a "pixel" for the sake of convenience.

Figure 2:
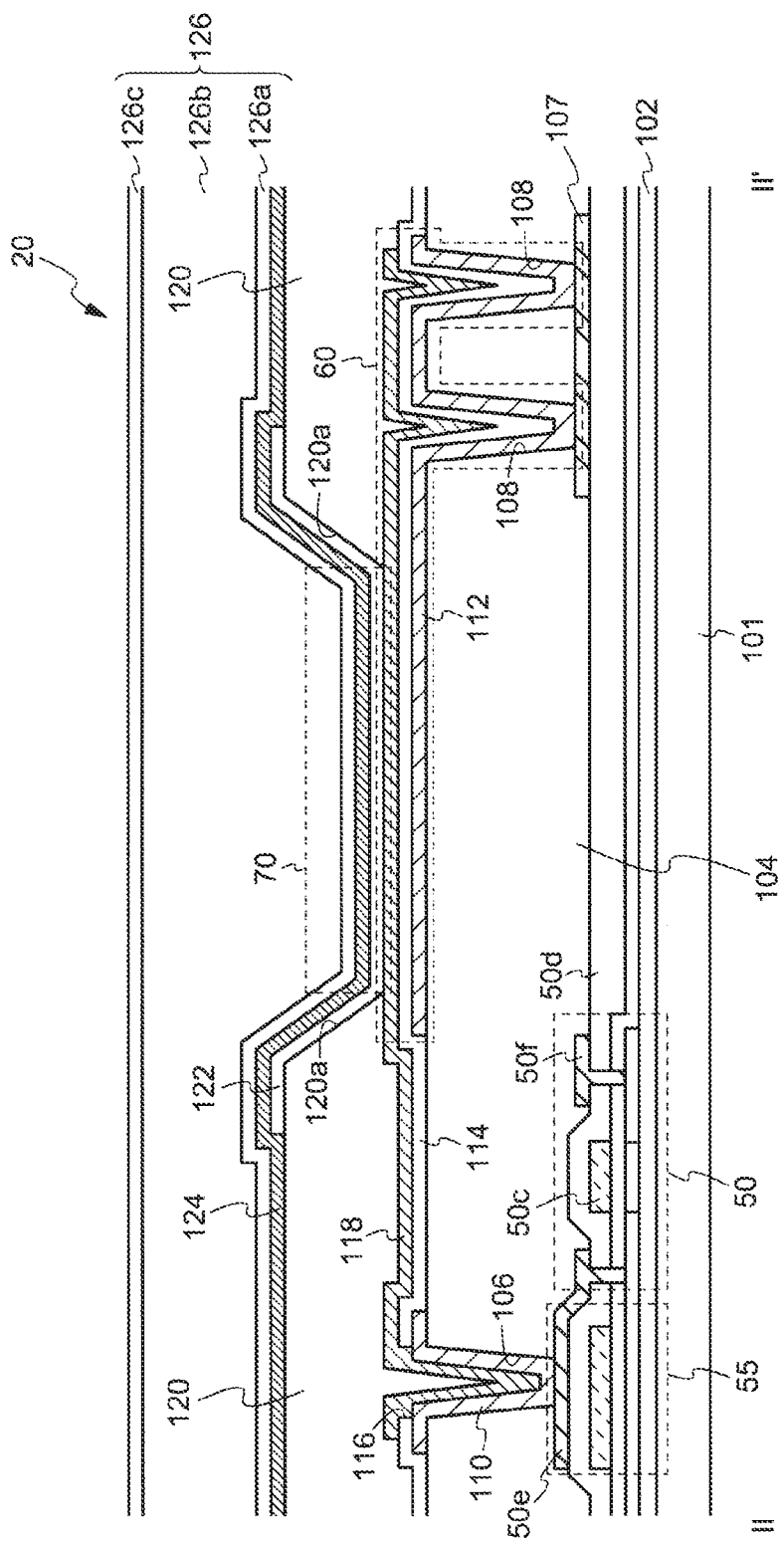
FIG. 2 is a cross-sectional view showing a structure of a pixel included in the organic EL display device in embodiment 1.
Figure 3:
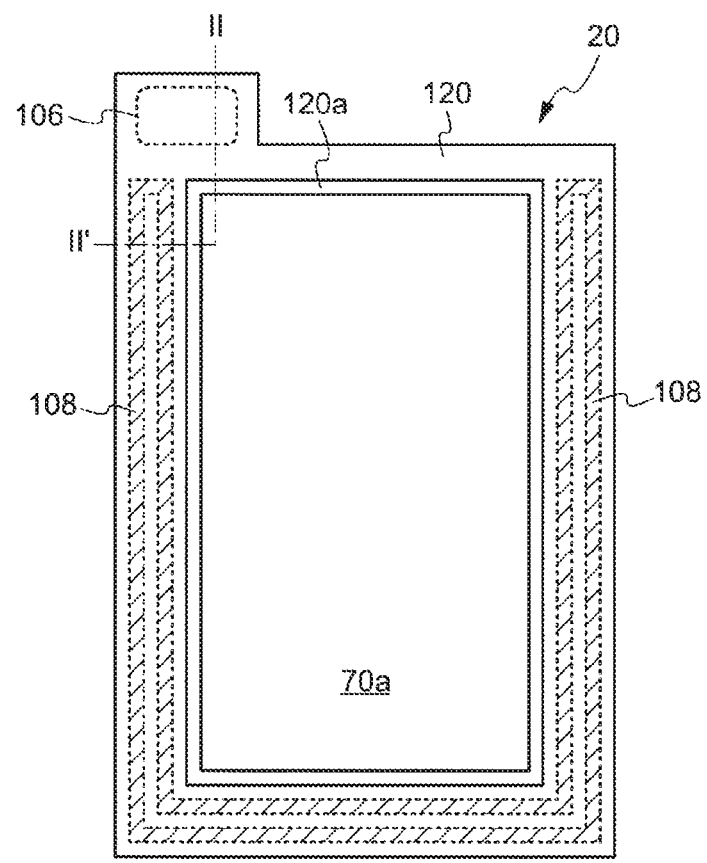
FIG. 3 is a plan view showing a structure of the pixel included in the organic EL display device in embodiment 1.

FIG. 2 is a cross-sectional view showing a structure of a pixel 20 in the organic EL display device 100 in embodiment 1. FIG. 3 is a plan view showing a structure of the pixel 20 in the organic EL display device 100 in embodiment 1. The cross-sectional view shown in FIG. 2 is taken along one-dot chain line II-II' in FIG. 3. In this embodiment, the structure of the pixel 20 will be described with reference to FIG. 2 or FIG. 3 optionally.

In this specification, the term "pixel" refers to a concept indicating one unit of an image. FIG. 3 shows a clear contour of the pixel 20 for the sake of convenience, but there may not be a clear border between two pixels 20 adjacent to each other. In this specification, a unit including a light emitting element (in this specification, the organic EL element 70) and a semiconductor element that supplies an electric current in accordance with the video signal to the light emitting element (in this embodiment, such a semiconductor element is a thin film transistor 50) will be referred to as a "pixel".

As shown in FIG. 2, the thin film transistor 50 is provided on the support substrate 101 with an underlying insulating layer 102 being provided between the thin film transistor 50 and the support substrate 101. In this embodiment, the support substrate 101 is a glass substrate. Alternatively, the support substrate 101 may be formed of a resin material such as acrylic resin, polyimide resin or the like. The underlying insulating layer 102 may be formed of an inorganic insulating material such as silicon oxide (SiO), silicon nitride (SiN), silicon oxide nitride (SiON) or the like.

The thin film transistor 50 is a so-called top gate-type thin film transistor. The thin film transistor 50 is not limited to this, and may be of any other appropriate type. The thin film transistor 50 shown in FIG. 2 acts as a driving transistor that supplies an electric current to the organic EL element 70 described below. In this embodiment, the thin film transistor 50 is an n-channel-type transistor. The structure of the thin film transistor 50 is known and will not be described in detail herein.

The thin film transistor 50 is connected with a pixel capacitor 55. The pixel capacitor 55 may be formed of two conductive layers and an insulating layer provided between the two conductive layers. The two conductive layers and the insulating layer are usable to form the thin film transistor 50. For example, the pixel capacitor 55 in this embodiment may be formed of a semiconductor layer forming as an active layer of the thin film transistor 50, a gate insulating layer and a capacitance electrode (electrode formed at the same time as a gate electrode 50c). The structure of the pixel capacitor 55 is not limited to this.

The thin film transistor 50 is covered with an organic insulating layer 104. The organic insulating layer 104 acts as a flattening film that flattens convexed and concaved portions caused by the shape of the thin film transistor 50. In this embodiment, the organic insulating layer 104 may contain a resin material such as acrylic resin, polyimide resin or the like.

The organic insulating layer 104 includes an opening 106. The opening 106 acts as a contact hole that connects a conductive layer 118 acting as a pixel electrode to the thin film transistor 50. Specifically, the conductive layer 118 is connected with the thin film transistor 50 via an oxide conductive layer 110. In this embodiment, the oxide conductive layer 110 is formed by patterning a thin film formed of a metal oxide material such as ITO (Indium Tin Oxide), IZO (Indium Zinc Oxide) or the like. The oxide conductive layer 110 is not limited to this, and may be formed of any other appropriate material. The oxide conductive layer 110 is connected with a part of the thin film transistor 50 that is exposed by the opening 106 (specifically, connected with a source electrode 50e).

An insulating layer 114 is located between the oxide conductive layer 110 and the conductive layer 118. The insulating layer 114 is formed of an inorganic material such as, for example, silicon nitride, silicon oxide, silicon oxide nitride or the like. In this embodiment, the insulating layer 114 acts as a dielectric element of a pixel capacitor 60 described below, and therefore, it is preferred that the insulating layer 114 is formed of silicon nitride, which has a high dielectric constant. The conductive layer 118 is connected with the oxide conductive layer 110 via an opening 116 formed in the insulating layer 114.

The organic insulating layer 104 includes a groove 108 separately from the opening 106. Specifically, as shown in FIG. 2 and FIG. 3, the groove 108 is located in a region overlapping an organic insulating layer 120 as seen in a plan view. The groove 108 is a recessed portion formed in the organic insulating layer 104 at the same time as the opening 106.

As shown in FIG. 3, as seen in a plan view, the groove 108 is located along an opening 120a formed in the organic insulating layer 120. Specifically, the groove 108 in this embodiment is located in two lines along the opening 120a. The structure of the groove 108 is not limited to the example shown in FIG. 3. For example, the groove 108 may be located in three lines along the opening 120a.

An oxide conductive layer 112 is provided on the organic insulating layer 104 as overlapping the groove 108 as seen in a plan view. The oxide conductive layer 112 is formed of the same material as that of the oxide conductive layer 110. Namely, the oxide conductive layer 110 and the oxide conductive layer 112 are present in the same layer. The oxide conductive layer 112 is also provided inside the groove 108 along the shape of the groove 108. The insulating layer 114 and the conductive layer 118 are provided on the organic insulating layer 104 as overlapping the groove 108 as seen in a plan view. The insulating layer 114 and the conductive layer 118 are both provided inside the groove 108 along the shape of the groove 108. Namely, as shown in FIG. 2, the oxide conductive layer 112, the insulating layer 114 and the conductive layer 118 are stacked inside the groove 108. In other words, a capacitor formed of the oxide conductive layer 112, the insulating layer 114 and the conductive layer 118 is formed inside the groove 108.

Since the capacitor inside the groove 108 includes the conductive layer 118 acting as a pixel electrode, and therefore, is electrically connected with the pixel electrode. The pixel electrode acts as an anode electrode of the organic EL element 70. Namely, the capacitor formed inside the groove 108 acts as a passive element electrically connected with the thin film transistor 50 and the organic EL element 70. In this embodiment, the capacitor formed inside the groove 108 is used as a part of the pixel capacitor 60.

As seen in a plan view, the oxide conductive layer 112, the insulating layer 114 and the conductive layer 118 are also stacked in a region overlapping the opening 120a provided in the organic insulating layer 120 (i.e., in a region overlapping the organic EL element 70). Namely, the pixel capacitor 60, which is flat plate-like, is also formed in the region overlapping the opening 120a as seen in a plan view.

As described above, in this embodiment, a part of the pixel capacitor 60 is located in the region overlapping the opening 120a as seen in a plan view and is also located inside the groove 108. Therefore, the area size of the pixel 20 may be fully utilized to form the pixel capacitor 60. In addition, a part of the pixel capacitor 60 that is inside the groove 108 is formed by use of a side surface and a bottom surface of the groove 108. Therefore, the pixel capacitor 60 is formed in a depth direction of the organic insulating layer 104, and thus the total area size of the capacitor acting as the pixel capacitor 60 is significantly increased.

As described above, in the display device 100 in this embodiment, the groove 108 provided in the organic insulating layer 104 is used to form the pixel capacitor 60, and thus the pixel capacitor 60 having a sufficient capacitance is provided with certainty in a small space of the pixel 20. The insulating layer 114 is formed of silicon nitride, which has a higher dielectric constant than the other layers formed of silicon oxide. This also contributes to forming the pixel capacitor 60 having a large capacitance in a small area size with certainty.

In this embodiment, the oxide conductive layer 112, which forms a part of the pixel capacitor 60, is electrically connected with a conductive layer 107 provided on an insulating layer 50d. The conductive layer 107 is formed of the same material as that of the source electrode 50e and a drain electrode 50f of the thin film transistor 50. Although not shown, in this embodiment, the conductive layer 107 is electrically connected with the gate electrode 50c of the thin film transistor 50. The conductive layer 107 and the gate electrode 50c may be electrically connected with each other via a contact hole (not shown) provided in the insulating layer 50d.

In this embodiment, the conductive layer 107 and the oxide conductive layer 112 are electrically connected with each other. Therefore, the pixel capacitor 60 is connected with the gate electrode 50c of the thin film transistor 50. Namely, in this embodiment, the gate electrode 50c of the thin film transistor 50, the pixel capacitor 60 and the organic EL element 70 are electrically connected with each other. The organic EL display device 100 is not limited to having such a structure, and the pixel capacitor 60 may be connected with any other part of the thin film transistor 50, or may be connected with any other semiconductor element different from the thin film transistor 50.

In this embodiment, the conductive layer 107 is located in a region overlapping the entirety of the groove 108 as seen in a plan view. Namely, as shown in FIG. 2, the conductive layer 107 and the oxide conductively layer 112 are electrically connected with each other at a plurality of positions. Such a structure has an advantage that even if a contact defect occurs at one of the positions, the electric connection is provided with certainty at another of the positions.

The organic insulating layer 120 is provided on the conductive layer 118 acting as the pixel electrode, and includes the opening 120a in a region overlapping a part of the conductive layer 118 as seen in a plan view. Namely, a part of the conductive layer 118 that is exposed by the opening 120a acts as a light emitting region 70a (see FIG. 3) of the organic EL element 70. The organic insulating layer 120 may be formed of an organic resin material such as acrylic resin, polyimide resin or the like, but the material of the organic insulating layer 120 is not limited to these.

As described above, the organic insulating layer 120 plays a role of defining the light emitting region 70a, and is referred to as a "bank" or a "rib". Oppositely describing, a region that overlaps the organic insulating layer 120 as seen in a plan view is a dead space and does not emit light. However, in this embodiment, the pixel capacitor 60 is formed also in the region overlapping the organic insulating layer 120 as seen in a plan view. In this manner, the dead space is effectively used; in other words, the area size in the pixel having a limited area size is effectively utilized.

Figure 4:
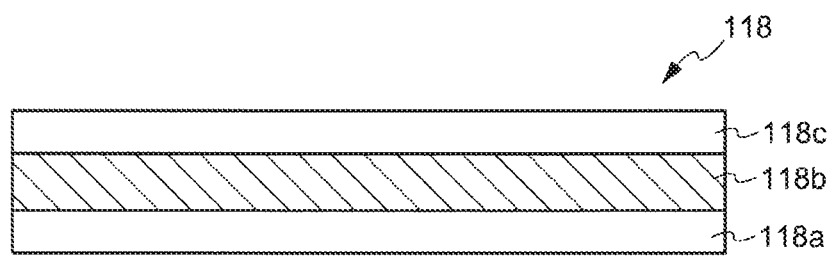
FIG. 4 is a cross-sectional view showing a structure of a pixel electrode included in the organic EL display device in embodiment 1.

In this embodiment, as shown in FIG. 4, the conductive layer 118 acting as the pixel electrode has a stack structure including an oxide conductive layer 118a, an oxide conductive layer 118c and a conductive layer 118b, containing silver or a silver alloy, held between the oxide conductive layers 118a and 118c. The oxide conductive layer 118a and the oxide conductive layer 118c may each be formed of a thin film containing a metal oxide such as ITO, IZO or the like described above. The conductive layer 118b containing silver or a silver alloy may be formed of a silver thin film or a silver alloy thin film. The oxide conductive layer 118c has a high work function and thus is suitable for the anode electrode of the organic EL element 70.

Light emitted from the organic EL element 70 is reflected by the conductive layer 118b included in the conductive layer 118 and containing silver or a silver alloy. Namely, the organic EL display device 100 in this embodiment has a structure in which the light emitted from the organic EL element 70 is output in a direction opposite to a direction toward the support substrate 101 (i.e., output in an upward direction). Therefore, in this embodiment, the region overlapping the organic EL element 70 as seen in a plan view is usable as the pixel capacitor 60.

The organic EL element 70 includes the conductive layer 118 acting as the pixel electrode (i.e., as the anode electrode of the organic EL element 70), an organic EL layer 122 covering the opening 120a of the organic insulating layer 120, and a conductive layer 124 acting as a common electrode (i.e., as a cathode electrode of the organic EL element 70).

Although not shown, the organic EL layer 122 includes at least a light emitting layer, and may also include any one of, or all of, an electron injection layer, an electron transfer layer, an electron blocking layer, a hole injection layer, a hole transfer layer and a hole blocking layer. The organic EL layer 122 may be formed of an organic EL material that emits, for example, red, blue or green light.

In this embodiment, the pixels 20 include light emitting layers that emit light of different colors. The pixels 20 are not limited to having such a structure. For example, although not shown, an organic EL layer that emits white light may be provided over the plurality of pixels 20. In this case, the white light is separated into light of the RGB colors by use of a color filter provided in each pixel. The functional layers such as the electron injection layer, the electron transfer layer, the electron blocking layer, the hole injection layer, the hole transfer layer and the hole blocking layer may be provided over the plurality of pixels 20.

The conductive layer 124 acting as the common electrode contains an alkaline metal material or an alkaline earth metal material. Usable examples of the alkaline metal material or alkaline earth metal material include magnesium (Mg), lithium (Li) and the like. In this embodiment, the conductive layer 124 is formed of an MgAg film, which is formed of an alloy of magnesium and silver. The conductive layer 124 is formed over the plurality of pixels 20.

In the case where the light that is output from the organic EL layer 122 is to be extracted upward, namely, through the conductive layer 124 (i.e., in the case where the organic EL display device 100 is of a top emission-type), the conductive layer 124 needs to be light-transmissive. In the case where the conductive layer 124 is formed of an alkaline metal material or an alkaline earth metal material as described above, the conductive layer 124 is formed as a film that is sufficiently thin to transmit the light, in order to be light-transmissive. Specifically, the conductive layer 124 may have a thickness of 10 nm or greater and 30 nm or less to be light-transmissive.

A sealing layer 126 is provided on the conductive layer 124 (i.e., on the organic EL element 70). The sealing layer 126 in this embodiment includes a first sealing layer 126a formed of an inorganic material, a second sealing layer 126b formed of an organic material and a third sealing layer 126c formed of an inorganic material, which are stacked in this order from the lowest layer. The sealing layer 126 plays a role of preventing entrance of moisture or the like from outside and thus preventing deterioration of the organic EL layer 122 and the conductive layer 124.

In this embodiment, the first sealing layer 126a and the third sealing layer 126c are formed of silicon nitride. The first sealing layer 126a and the third sealing layer 126c are not limited to being formed of silicon nitride, and may be formed of silicon oxide or silicon oxide nitride instead of silicon nitride. Namely, the first sealing layer 126a and the third sealing layer 126c may be formed of an inorganic insulating material. Among inorganic insulating materials, an insulating material containing silicon nitride is especially preferred.

The second sealing layer 126b is formed of an organic insulating material, specifically, a resin material. In this embodiment, with the structure in which the second sealing layer 126b is formed of an organic insulating material, specifically, a resin material, the concaved and convexed portions provided by the opening 120a of the organic insulating layer 120 are flattened. The first sealing layer 126a has a thickness of about 1 □m, and therefore, is formed along an inclining surface of the opening 120a. By contrast, the second sealing layer 126b has a thickness of about 10 □m, and sufficiently buries the stepped portion provided by the opening 120a.

<Method for Producing the Display Device>

Now, a method for producing the organic EL display device 100 in this embodiment will be described. FIG. 5 to FIG. 9 are each a cross-sectional view showing a step of the method for producing the organic EL display device 100 in embodiment 1.

Figure 5:
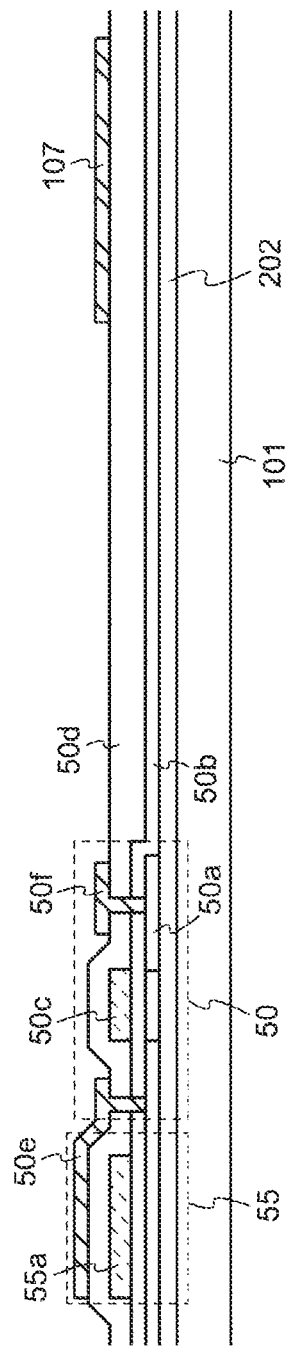
FIG. 5 is a cross-sectional view showing a step of a method for producing the organic EL display device in embodiment 1.

First, as shown in FIG. 5, the thin film transistor 50 and the pixel capacitor 55 are formed on the support substrate 101. There is no specific limitation on the method for forming the thin film transistor 50 or the pixel capacitor 55, and the thin film transistor 50 and the pixel capacitor 55 may be formed by a known method. The support substrate 101 is a glass substrate in this embodiment, but may be any other appropriate insulating substrate.

In the case where the support substrate 101 is a flexible substrate formed of a resin material, a resin layer of polyimide or the like is formed on a support plate formed of glass or the like, and the thin film transistor 50 and the pixel capacitor 55 are formed on the resin layer. After the first sealing layer 126a, the second sealing layer 126b and the third sealing layer 126c shown in FIG. 2 are formed, the resin layer and the other layers thereon may be peeled off from the support plate.

In this embodiment, the underlying insulating layer 102 is formed on the support substrate 101, and the semiconductor layer 50a is formed on the underlying insulating layer 102. Next, the gate insulating layer 50b covering the semiconductor layer 50a is formed. After the gate insulating layer 50b is formed, the gate electrode 50c is formed on a region of the gate insulating layer 50b that overlaps the semiconductor layer 50a. At the same time as the formation of the gate electrode 50c, a capacitance electrode 55a forming a part of the pixel capacitor 55 is formed.

Next, the insulating layer 50d covering the gate electrode 50c and the capacitance electrode 55a is formed. Then, the source electrode 50e and the drain electrode 50f are formed to be connected with the semiconductor layer 50a via a contact hole formed in the gate insulating layer 50b and the insulating layer 50d. At this point, the source electrode 50e is formed to overlap the capacitance electrode 55a as seen in a plan view. In this manner, the thin film transistor 50 and the pixel capacitor 55 are formed on the support substrate 101.

At the same time as the formation of the source electrode 50e and the drain electrode 50f, the conductive layer 107 is formed on the insulating layer 50d. In this embodiment, a contact hole (not shown) is formed in the insulating layer 50d in advance so that the conductive layer 107 and the gate electrode 50c are electrically connected with each other.

Figure 6:
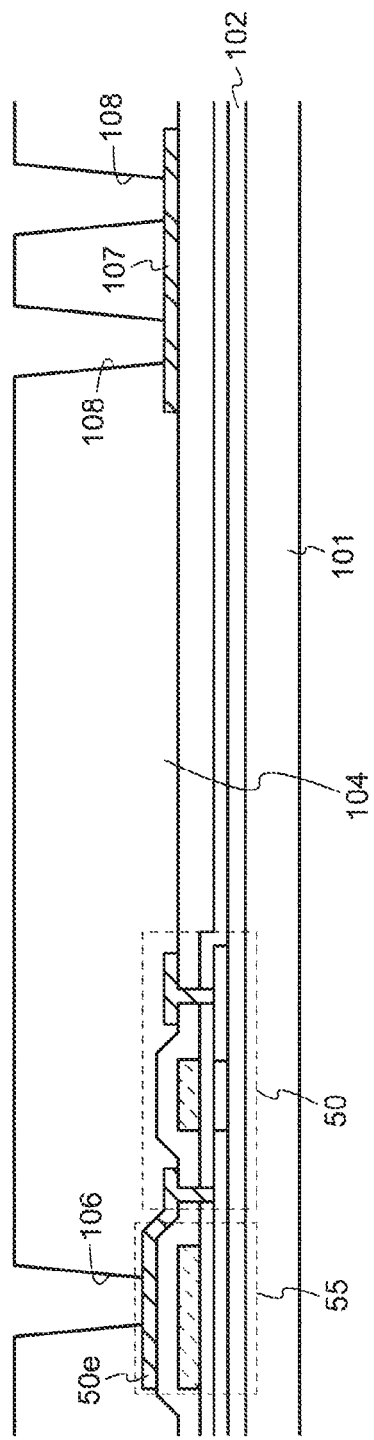
FIG. 6 is a cross-sectional view showing a step of the method for producing the organic EL display device in embodiment 1.

After the thin film transistor 50 and the pixel capacitor 55 are formed, as shown in FIG. 6, the organic insulating layer 104 is formed. In this embodiment, the organic insulating layer 104 is formed of an acrylic resin material having a positive photosensitivity. In more detail, the acrylic resin material to be used to form the organic insulating layer 104 is applied, and regions of the acrylic resin material where the opening 106 and the groove 108 are to be formed are selectively exposed to light, and thus the acrylic resin material is patterned by photolithography. Thus, unnecessary parts of the acrylic resin material are removed. In this manner, the organic insulating layer 104 including the opening 106 and the groove 108 may be formed with no separate etching process. As shown in FIG. 6, the opening 106 is formed to expose a part of the thin film transistor 50 (specifically, to expose a part of the source electrode 50e). The groove 108 is formed to expose a part of the conductive layer 107. At this point, the source electrode 50e and the conductive layer 107 each act as an etching stopper for removing the part of the acrylic resin material.

Figure 7:
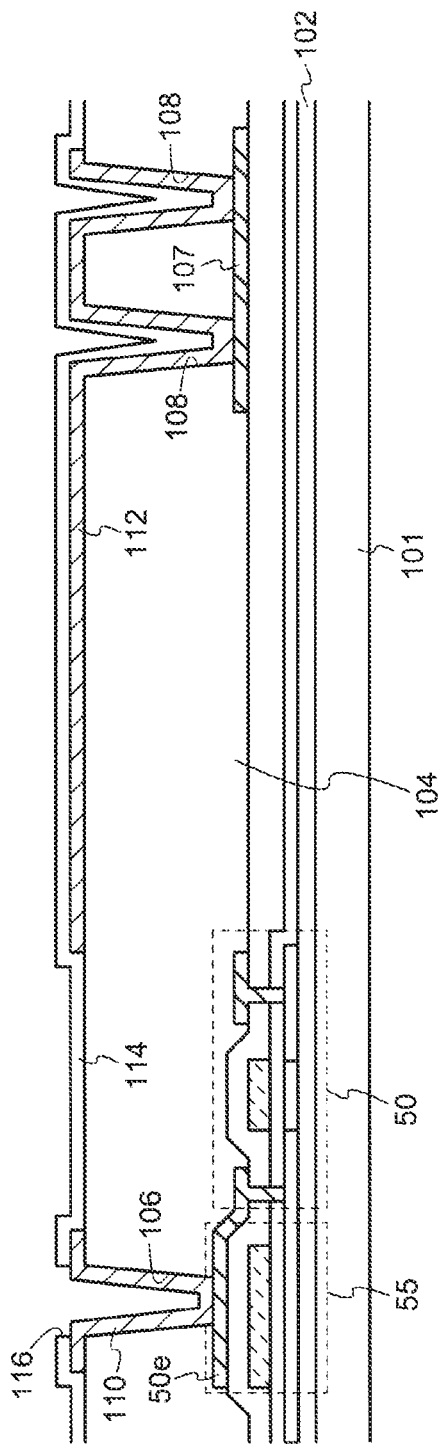
FIG. 7 is a cross-sectional view showing a step of the method for producing the organic EL display device in embodiment 1.

After the opening 106 and the groove 108 are formed in the organic insulating layer 104, as shown in FIG. 7, the oxide conductive layer 110 and the oxide conductive layer 112 are formed of a metal oxide material such as ITO or the like on the organic insulating layer 104. The oxide conductive layer 110 is formed to cover the opening 106, and is electrically connected with the source electrode 50e of the thin film transistor 50. The oxide conductive layer 112 is formed to cover the groove 108, and is electrically connected with the conductive layer 107. At this point, the oxide conductive layer 112 is formed to also overlap a region where the organic EL element 70 is to be formed, as seen in a plan view.

After the oxide conductive layer 110 and the oxide conductive layer 112 are formed, the insulating layer 114 is formed of an inorganic material (in this embodiment, silicon nitride). After the insulating layer 114 is formed, the opening 116 is formed by photolithography. The opening 116 is formed in a region overlapping the oxide conductive layer 110 as seen in a plan view. In this embodiment, the opening 116 is formed in a region overlapping the opening 106, provided in the organic insulating layer 104, as seen in a plan view. Alternatively, the opening 116 may be formed in a region not overlapping the opening 106 as seen in a plan view.

At this point, the insulating layer 114 is stacked on the oxide conductive layer 112 inside the groove 108. The insulating layer 114 acts as a protective film that prevents moisture or the like generated in the organic insulating layer 104 from influencing the organic EL element 70, and also acts as a dielectric element of the pixel capacitor 60.

Figure 8:
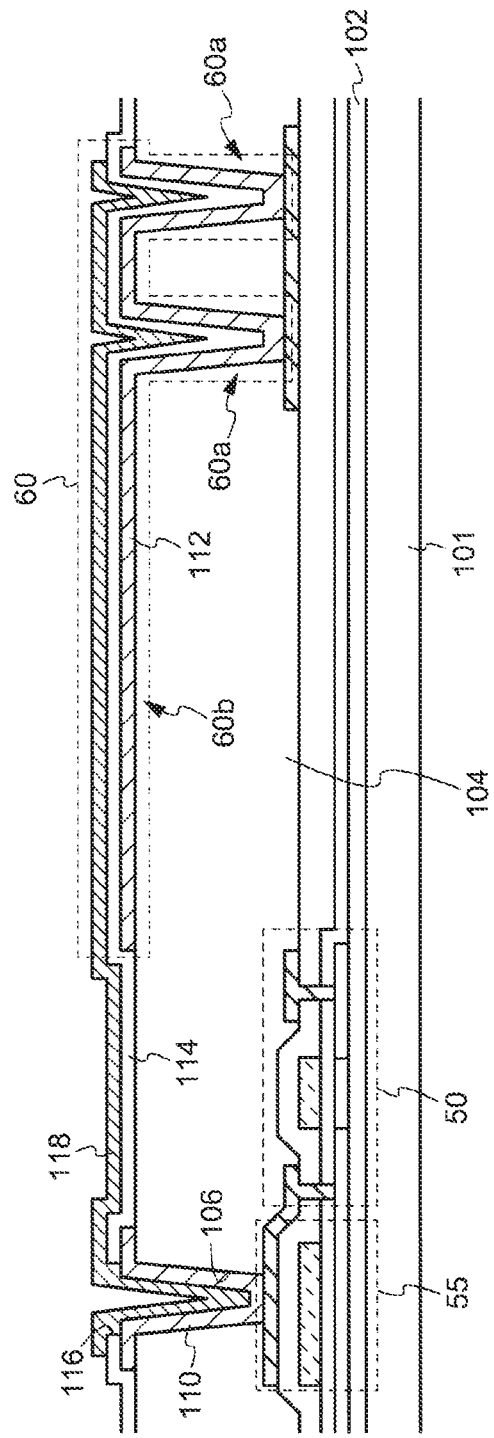
FIG. 8 is a cross-sectional view showing a step of the method for producing the organic EL display device in embodiment 1.

After the opening 116 is formed in the insulating layer 114, as shown in FIG. 8, the conductive layer 118 is formed on the insulating layer 114. The conductive layer 118 is electrically connected with the oxide conductive layer 110 via the opening 116. Namely, the conductive layer 118 is electrically connected with the thin film transistor 50 via the oxide conductive layer 110. Thus, the conductive layer 118 acts as a pixel electrode.

At the time when the conductive layer 118 is formed, the pixel capacitor 60 formed of the oxide conductive layer 112, the insulating layer 114 and the conductive layer 118 is formed. The conductive layer 118 is formed in to extend from the inside of the opening 106 to the inside of the groove 108 both formed in the organic insulating layer 104. Therefore, the pixel capacitor 60 includes a first portion 60a located inside the groove 108 and a second portion 60b located in the region overlapping the organic EL element 70 as seen in a plan view.

The conductive layer 118 has a stack structure in which the conductive layer 118b containing silver or a silver alloy is held between the oxide conductive layer 118a and the oxide conductive layer 118b as shown in FIG. 4. For forming conductive layer 118 having such a stack structure, the conductive layers may be continuously stacked and then etched at the same time, or the layers may be formed and etched one by one.

Figure 9:
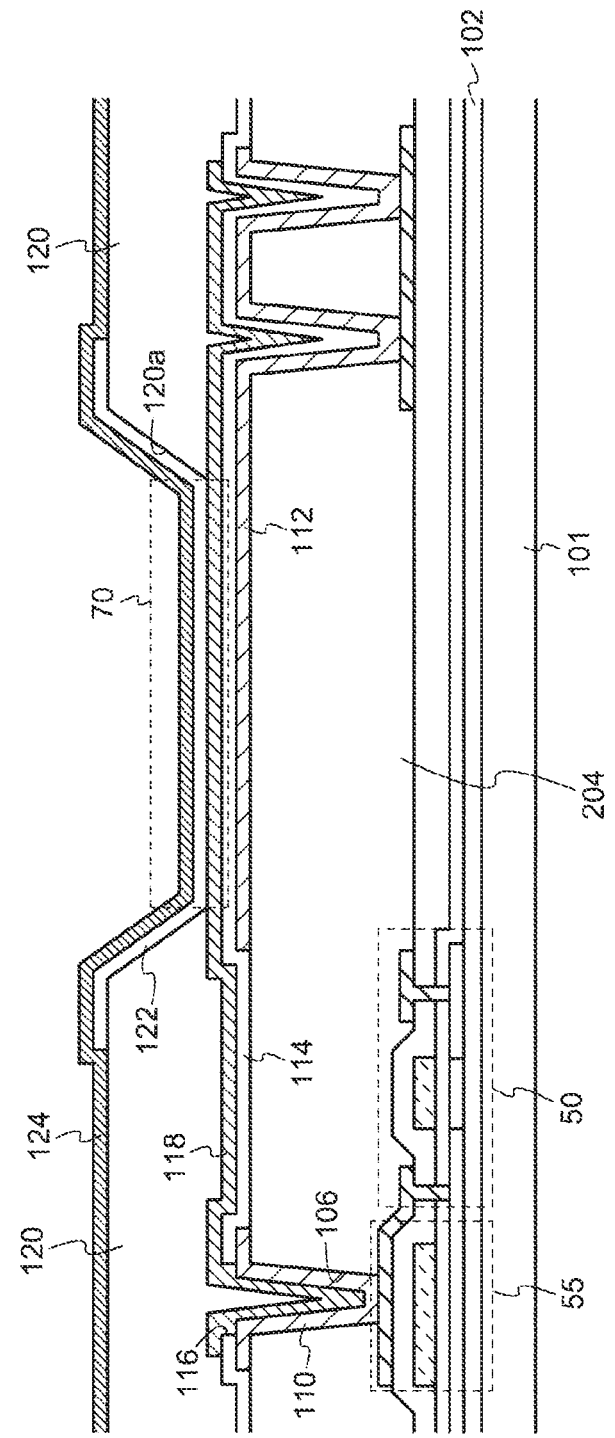
FIG. 9 is a cross-sectional view showing a step of the method for producing the organic EL display device in embodiment 1.

After the conductive layer 118 is formed, as shown in FIG. 9, the organic insulating layer 120 acting as the bank is formed. In this embodiment, the organic insulating layer 120 is formed of a photosensitive acrylic resin material. The opening 120a is formed in the organic insulating layer 120 in a region overlapping a part of the conductive layer 118. The opening 120a defines the region where the organic EL layer 70 is to be formed (i.e., defines the light emitting region 70a) on a top surface of the conductive layer 118.

After the organic insulating layer 120 is formed, the organic EL layer 122 and the conductive layer 124 acting as the common electrode are formed. In this embodiment, the organic EL layer 122 and the conductive layer 124 are formed by vapor deposition and are formed for each of the plurality of pixels 20 separately. The organic EL layer 122 and the conductive layer 124 are not limited to being formed in this manner. For example, the functional layers other than the light emitting layer, for example, the electron transfer layer, the hole transfer layer and the like may be commonly formed for the plurality of pixels 20. There is no specific limitation on the material of the organic EL layer 122 in this embodiment, and the organic EL layer 122 may be formed of any appropriate known material.

In this embodiment, the conductive layer 124 is formed of an MgAg film, which is an alloy containing magnesium and silver. The conductive layer 124 formed of such an alkaline metal material or alkaline earth metal material is weak against, for example, moisture, like the organic EL layer 122. Therefore, it is preferred that the vapor deposition to form the organic EL layer 122 and the vapor deposition to form the conductive layer 124 are performed without releasing a film formation chamber to the outside air. In this case, it is preferred that the organic EL layer 122 and the conductive layer 124 are formed continuously by vapor deposition while a vacuum state is maintained. Alternatively, the organic EL layer 122 and the conductive layer 124 may be formed continuously by vapor deposition while an inactive atmosphere such as a nitrogen atmosphere or the like is maintained.

At this point, the organic EL element 70 formed of the conductive layer 118 acting as the pixel electrode (anode electrode), the organic EL layer 122 and the conductive layer 124 acting as the cathode electrode is formed in the opening 120a formed in the organic insulating layer 120.

After this, the first sealing layer 126a formed of silicon nitride, the second sealing layer 126b formed of a resin material, and the third sealing layer 126c formed of silicon nitride are stacked in this order. As a result, the organic EL display device 100 shown in FIG. 2 is produced.

Embodiment 2

In this embodiment, an example in which the structure of the conductive layer located below the groove 108 is different from that in embodiment 1 will be described. In this embodiment, components common to those of the organic EL display device 100 in embodiment 1 will bear the identical reference signs thereto and descriptions thereof will be omitted.

Figure 10:
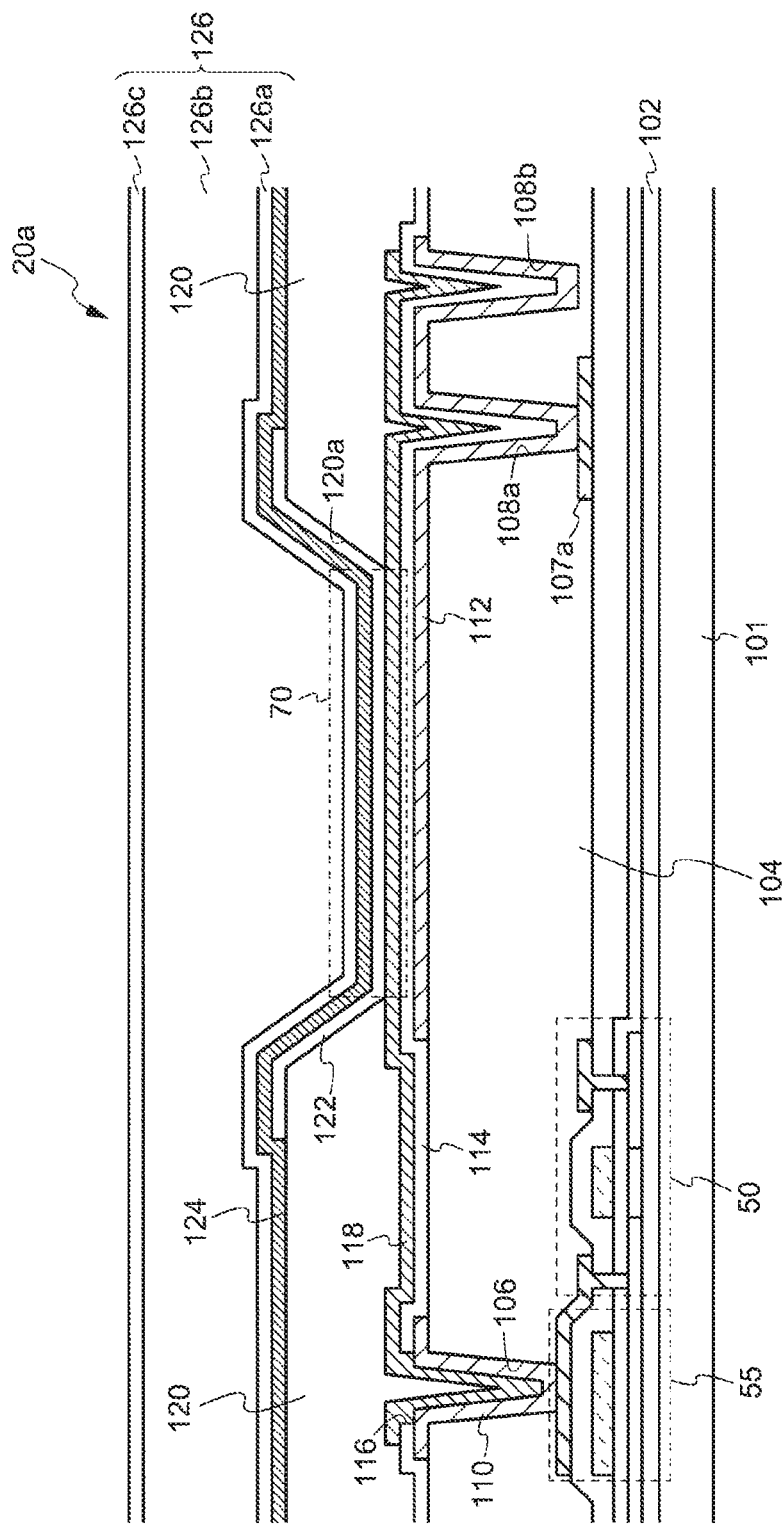
FIG. 10 is a cross-sectional view showing a structure of a pixel included in an organic EL display device in embodiment 2.

FIG. 10 is a cross-sectional view showing a structure of a pixel 20a included an organic EL display device in embodiment 2. In embodiment 1, the conductive layer 107 is located in a region overlapping the groove 108 as seen in a plan view. In this embodiment, a conductive layer 107a is located in a region overlapping a part of the groove 108. In this embodiment, the groove 108 shown in the cross-sectional view of FIG. 10 will be described as being divided into a groove 108a and a groove 108b for the sake of convenience.

As shown in FIG. 10, in this embodiment, the conductive layer 107a is located in a region overlapping the groove 108a as seen in a plan view, but is not located in a region overlapping the groove 108b. In this case, the conductive layer 107a and the oxide conductive layer 112 are electrically connected with each other in the region overlapping the groove 108a. In this embodiment, the conductive layer 107a is connected with the gate electrode 50c of the thin film transistor 50, like in embodiment 1.

As described above, the connection portion between the pixel capacitor 60 and the conductive layer 107a may be located in the region overlapping a part of the groove 108.

Embodiment 3

In this embodiment, an example in which the conductive layer acting as the pixel electrode is formed as being divided into at least two layers will be described. In this embodiment, components common to those of the organic EL display device 100 in embodiment 1 will bear the identical reference signs thereto and descriptions thereof will be omitted.

Figure 11:
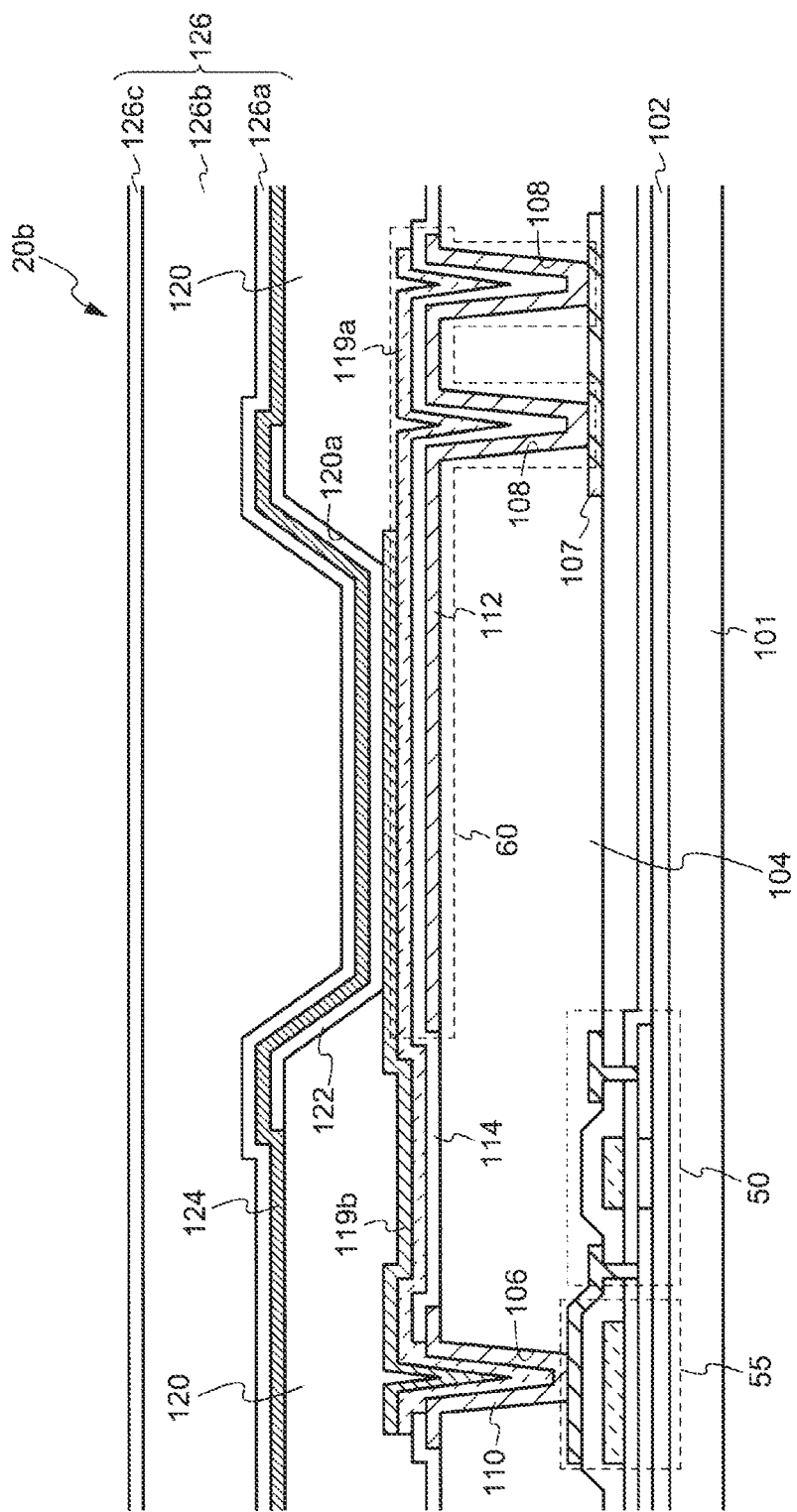
FIG. 11 is a cross-sectional view showing a structure of a pixel included in an organic EL display device in embodiment 3.

FIG. 11 is a cross-sectional view showing a structure of a pixel 20b included in an organic EL display device in embodiment 3. In embodiment 1, the conductive layer acting as the pixel electrode is the conductive layer 118 including the three layers shown in FIG. 4. In this embodiment, the conductive layer 118 including the three layers are formed as being divided into two layers. More specifically, as shown in FIG. 11, the oxide conductive layer 118a shown in FIG. 4 is treated as an oxide conductive layer 119a, and a stack of the conductive layer 118b and the oxide conductive layer 118c shown in FIG. 4 is treated as a conductive layer 119b.

As shown in FIG. 11, the oxide conductive layer 119a is formed of a metal oxide material, and acts as one of a pair of electrodes forming the pixel capacitor 60. Namely, the oxide conductive layer 119a extends from the inside of the opening 106 of the organic insulating layer 104 to the region overlapping the groove 108.

By contrast, the conductive layer 119b has a stack structure including a conductive layer containing silver or a silver alloy and a conductive layer formed of a metal oxide material, and acts as the pixel electrode. Namely, the conductive layer 119b extends from the inside of the opening 106 of the organic insulating layer 104 to the region overlapping the opening 120a of the organic insulating layer 120 as seen in a plan view, but not to the region overlapping the groove 108.

As described above, the conductive layer 118 including the three layers shown in FIG. 4 may be provided such that the layers are located in different regions from each other in accordance with the respective roles of the layers.

Embodiment 4

In this embodiment, an example a groove 109 is provided in the region overlapping the opening 120a of the organic insulating layer 120 as seen in a plan view in addition to the groove 108 will be described. In this embodiment, components common to those in the organic EL display device 100 in embodiment 1 will bear the identical reference signs thereto and descriptions thereof will be omitted.

Figure 12:
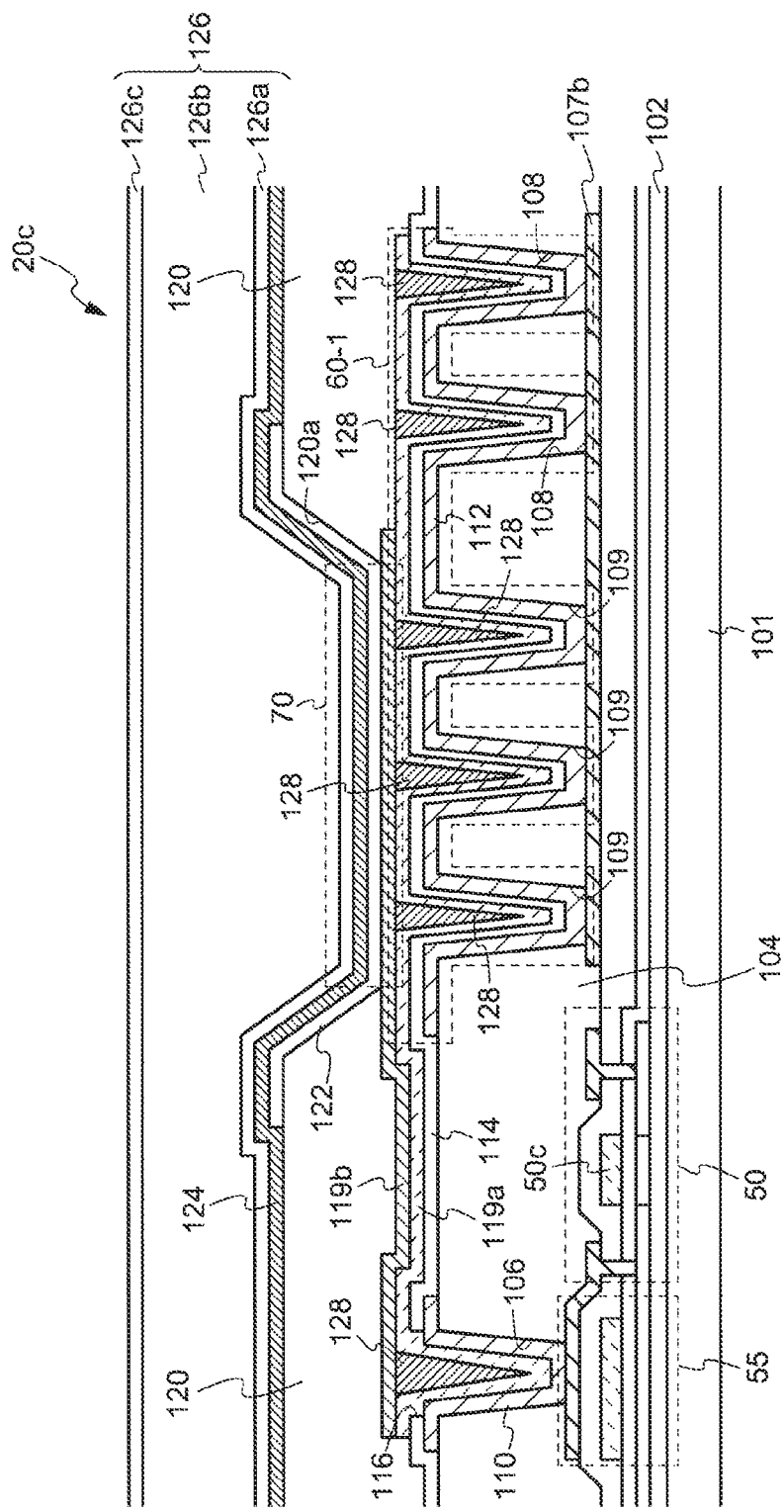
FIG. 12 is a cross-sectional view showing a structure of a pixel included in an organic EL display device in embodiment 4.

FIG. 12 is a cross-sectional view showing a structure of a pixel 20c included in an organic EL display device in embodiment 4. In embodiment 1, the groove 108 is provided in the region overlapping the organic insulating layer 120 as seen in a plan view, but no groove is provided in the region overlapping the opening 120a. By contrast, in this embodiment, the groove 109 is provided in the region overlapping the opening 120a of the organic insulating layer 120 as seen in a plan view, in addition to the groove 108.

In this embodiment, a capacitor formed of the oxide conductive layer 112, the insulating layer 114 and the oxide conductive layer 119a is formed inside the groove 109 in addition to inside the groove 108. Namely, in this embodiment, a pixel capacitor 60-1 includes a portion located inside the groove 108 and a portion located inside the groove 109. In this embodiment, a conductive layer 107b is provided in a region overlapping the groove 108 and the groove 109 as seen in a plan view. The conductive layer 107b is electrically connected with the gate electrode 50c of the thin film transistor 50, like in embodiment 1.

As described above, in this embodiment, the groove 109 is provided in the region overlapping the opening 120a of the organic insulating layer 120 (i.e., in the region overlapping the organic EL layer 70) as seen in a plan view, and a part of the pixel capacitor 60-1 is formed inside the groove 109. With such a structure, the dead space below the organic EL element 70 is effectively used, and thus the capacitance of the pixel capacitor 60-1 is increased as compared with the capacitor in embodiment 1.

With the structure in this embodiment, a recessed portion along the shape of the groove 109 is formed below the organic EL element 70. In the case where such a recessed portion is formed, the flatness of the anode electrode of the organic EL element 70 is spoiled, and the light emitted from the organic EL element 70 is scattered in various directions. As a result, the extraction efficiency of the light emitted from the organic EL element 70 may be undesirably decreased.

In this embodiment, in order to avoid this, the recessed portion caused by the groove 109 is filled with a filler 128 formed of a resin material. In this embodiment, a recessed portion caused by the groove 108 and a recessed portion caused by the opening 106 of the organic insulating layer 104 are also filled with the filler 128. It should be noted that the recessed portion caused by the groove 108 and the recessed portion caused by the opening 106 of the organic insulating layer 104 may be filled with the organic insulating layer 120, and therefore do not need to be filled with filler 108.

In this embodiment, the pixel capacitor 60-1 is formed by use of the inside of the groove 108 and the inside of the groove 109, and the flatness of the organic EL element 70 (especially, the flatness of the anode electrode) is guaranteed. Specifically, as described above in embodiment 3, the conductive layer 118 acting as the pixel electrode is formed as being divided into the oxide conductive layer 119a and the conductive layer 119b. Therefore, the pixel 20c in this embodiment has a structure in which the filler 128 is held between the oxide conductive layer 119a and the conductive layer 119b in the region overlapping the opening 120a.

Figure 13:
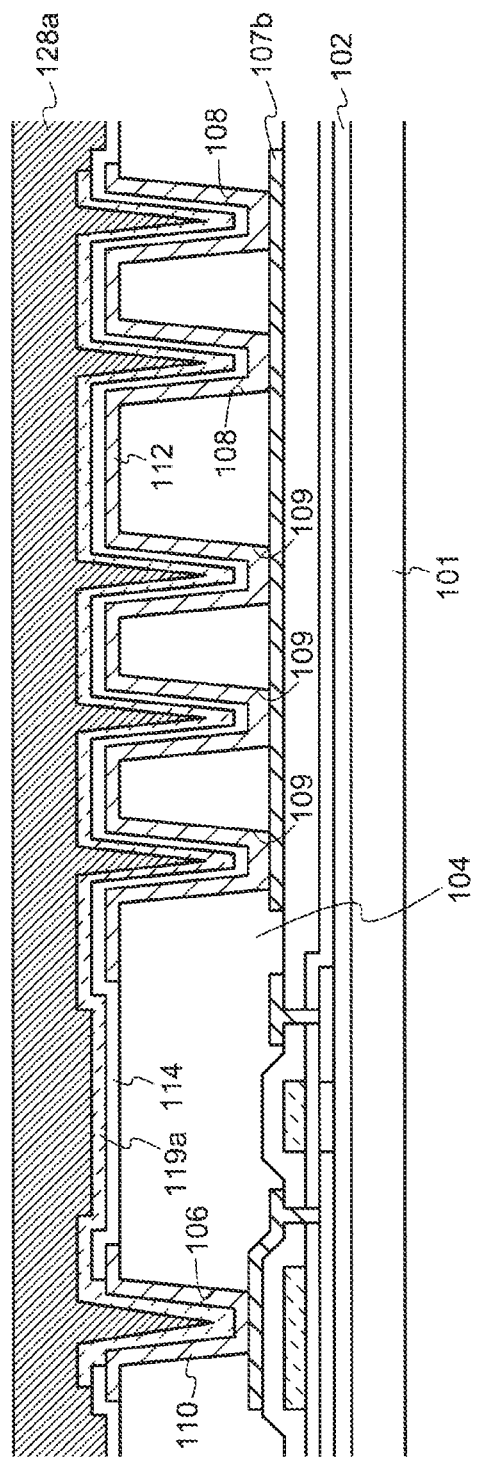
FIG. 13 is a cross-sectional view showing a step of a method for producing the organic EL display device in embodiment 4.

Such a structure is formed as follows in actuality. When the layers are formed to provide the state shown in FIG. 7 as described above in embodiment 1, as shown in FIG. 13, the oxide conductive layer 119a is formed of a metal oxide material. Then, a resin layer 128a is formed on the oxide conductive layer 119 by a method such as solution coating or the like. As a result, the recessed portions caused by the groove 108 the groove 109 and the opening 106 of the organic insulating layer 104 are filled with the resin layer 128a.

Figure 14:
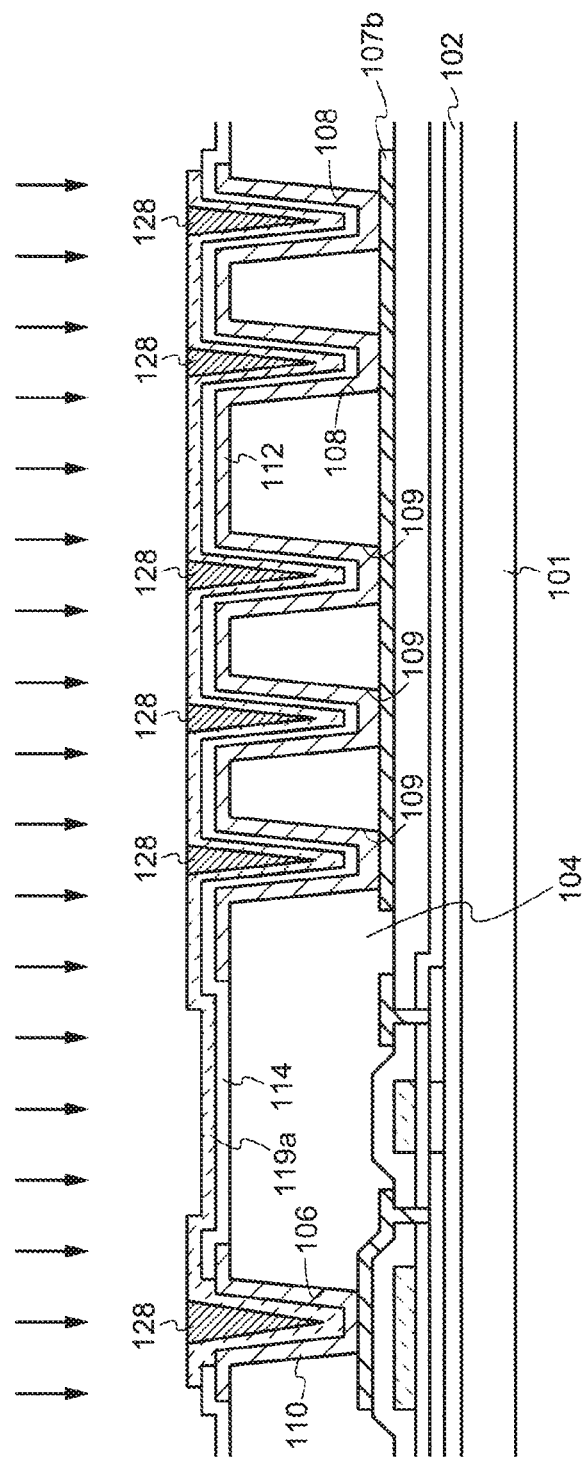
FIG. 14 is a cross-sectional view showing a step of the method for producing the organic EL display device in embodiment 4.

After the resin layer 128a is formed, as shown in FIG. 14, the resin layer 128a is etched until a top surface of the oxide conductive layer 119a is exposed. The etching of the resin layer 128a may be performed by use of a technology such as, for example, ashing using oxygen-containing gas. The etching is stopped when the oxide conductive layer 119a is exposed. In this manner, the resin material is left in the recessed portions caused by the groove 108 the groove 109 and the opening 106, and acts as the filler 128 shown in FIG. 12.

With the above-described steps, the recessed portions caused by the groove 108 the groove 109 and the opening 106 of the organic insulating layer 104 are flattened by the filler 128. Thus, the flatness of the conductive layer 119b acting as the pixel electrode (anode electrode) is guaranteed, and the extraction efficiency of the light emitted from the organic EL element 70 is improved.

Embodiment 5

In this embodiment, an example in which the structure of the conductive layer located below the groove 108 and the groove 109 is different from that in embodiment 4 will be described. In this embodiment, components common to those of the organic EL display devices in embodiment 1 and embodiment 4 will bear the identical reference signs thereto and descriptions thereof will be omitted.

Figure 15:
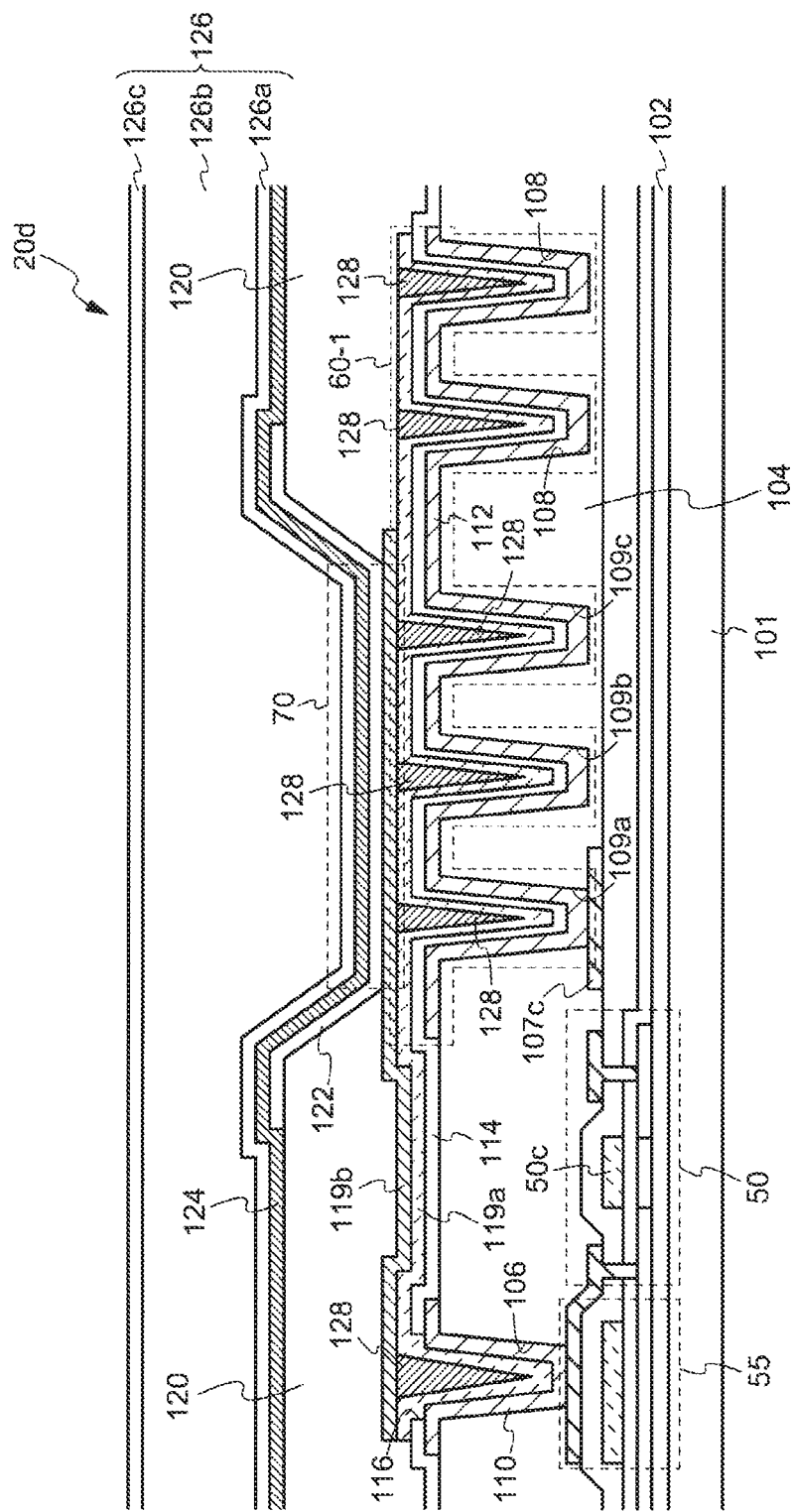
FIG. 15 is a cross-sectional view showing a structure of a pixel included in an organic EL display device in embodiment 5.

FIG. 15 is a cross-sectional view showing a structure of a pixel 20d included in an organic EL display device in embodiment 5. In embodiment 4, the conductive layer 107b is located in the region overlapping the groove 108 and the groove 109 as seen in a plan view. In this embodiment, a conductive layer 107c is located in a region overlapping a part of the groove 109. In this embodiment, the groove 109 shown in the cross-sectional view of FIG. 15 will be described as being divided into a groove 109a, 109b and 109c for the sake of convenience.

As shown in FIG. 15, in this embodiment, the conductive layer 107c is located in a region overlapping the groove 109a as seen in a plan view, but is not located in a region overlapping the groove 109b or the groove 109c. In this case, the conductive layer 107c and the oxide conductive layer 112 are electrically connected with each other in the region overlapping the groove 109a as seen in a plan view. In this embodiment, the conductive layer 107c is connected with the gate electrode 50c of the thin film transistor 50, like in embodiment 1.

As described above, the connection portion between the pixel capacitor 60-1 and the conductive layer 107c may be located in a region overlapping a part of the groove 109 (specifically, the groove 109c). Although not shown, another conductive layer electrically connected with the conductive layer 107c may be provided in the region overlapping the groove 108 in order to increase the redundancy of the connection portion between the pixel capacitor 60-1 and the conductive layer 107c.

Embodiment 6

In this embodiment, examples in which the layout of the groove 108 as seen in a plan view are different from that in embodiment 1 will be described. In this embodiment, components common to those of the organic EL display device 100 in embodiment 1 will bear the identical reference signs thereto and descriptions thereof will be omitted.

Figure 16:
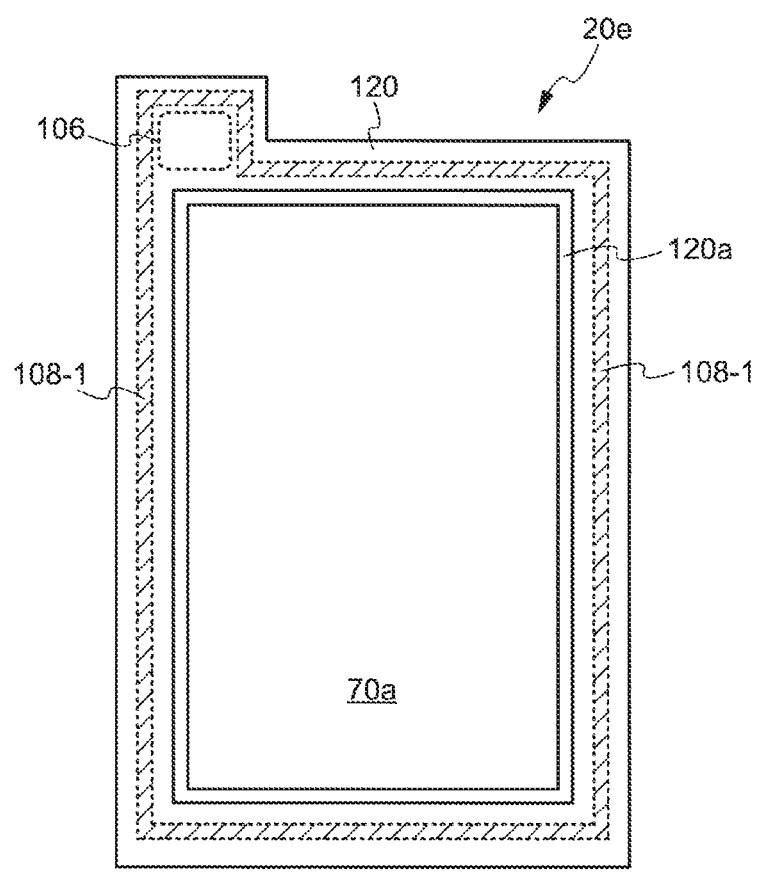
FIG. 16 is a plan view showing a structure of a pixel included in an organic EL display device in embodiment 6.
Figure 17:
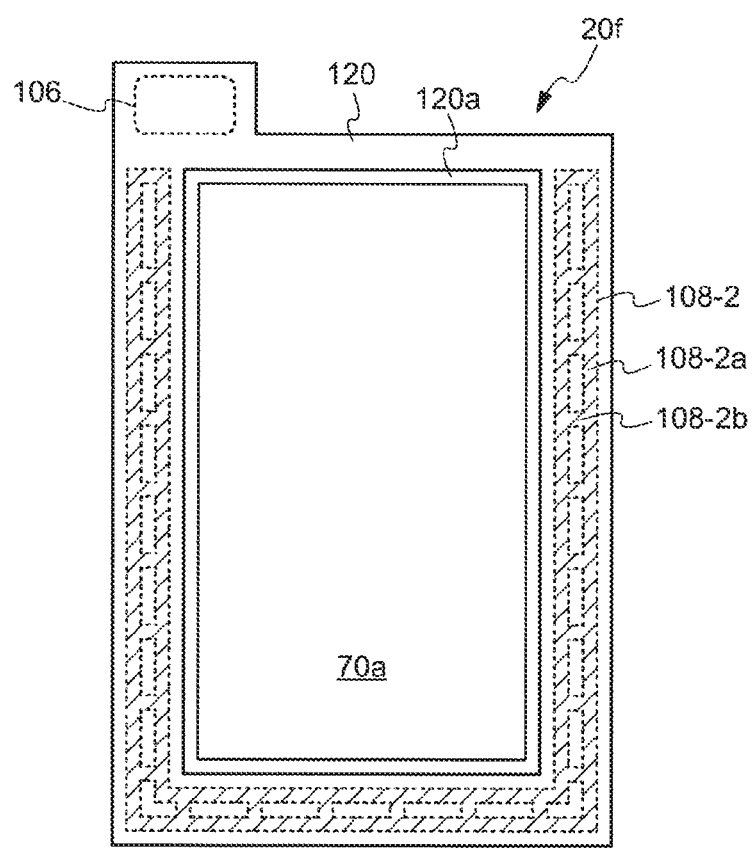
FIG. 17 is a plan view showing a structure of a pixel included in an organic EL display device in embodiment 6.
Figure 18:
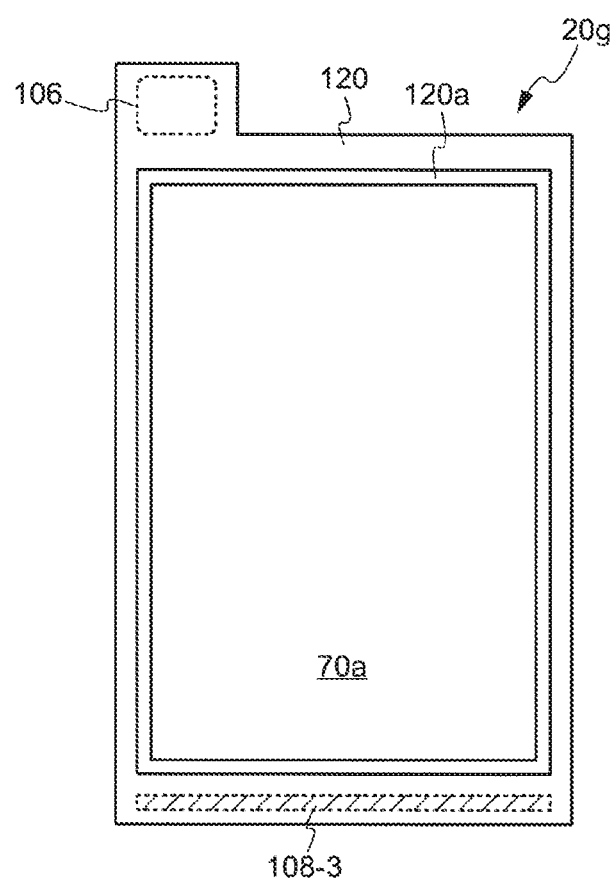
FIG. 18 is a plan view showing a structure of a pixel included in an organic EL display device in embodiment 6.

FIG. 16 is a plan view showing a structure of a pixel 20e included in an organic EL display device in embodiment 6. FIG. 17 is a plan view showing a structure of a pixel 20f included in an organic EL display device in embodiment 6. FIG. 18 is a plan view showing a structure of a pixel 20g included in an organic EL display device in embodiment 6.

With the structure of the pixel 20e shown in FIG. 16, a groove 108-1 is located to enclose the opening 106 of the organic insulating layer 104 as well as the opening 120a of the organic insulating layer 120. In the case where the groove 108 is formed to have a maximum possible length in this manner, the pixel capacitor has a required capacitance without the groove 108 being located in two lines as shown in FIG. 3. In addition, the groove 108-1 requires a smaller space to be formed around the light emitting region 70a, and therefore, the light emitting region 70a may be made larger.

With the structure of the pixel 20f shown in FIG. 17, a groove 180-2 includes a first portion 108-2a located along the opening 120a of the organic insulating layer 120 and second portions 108-2b extending in a direction crossing a longitudinal direction of the first portion 108-2a. In other words, the groove 108-2 includes the second portions 108-2b in addition to the groove 108 shown in FIG. 3. Such a structure increases the capacitance as compared with that in embodiment 1.

With the structure of the pixel 20g shown in FIG. 18, a groove 108-3 is located along one side of the opening 120a of the organic insulating layer 120. In this manner, the groove 108-3 may be made shorter as long as a required capacitance is provided. In this embodiment, the groove 108-3 is shorter, but the pixel capacitor is formed in the depth direction of the organic insulating layer 104. Therefore, a large capacitance is provided than in the case where the planar area size of the pixel capacitor is increased.

The above-described embodiments according to the present invention may be optionally combined as long as no contradiction occurs. The display devices described above in embodiments according to the present invention may have an element added thereto, or deleted therefrom, or may be changed in design optionally by a person of ordinary skill in the art. The methods described above in embodiments according to the present invention may have a step added thereto, or deleted therefrom, or may be changed in the condition optionally by a person of ordinary skill in the art. Such devices and methods are encompassed in the scope of the present invention as long as including the gist of the present invention.

Even functions and effects that are different from those provided by the above-described embodiments but are obvious from the description of this specification or are easily expectable by a person of ordinary skill in the art are naturally construed as being located by the present invention.

What is claimed is:

1. An organic EL display device, comprising:
   a thin film transistor;
   a first insulating layer covering the thin film transistor;
   a first conductive layer on the first insulating layer;
   a second insulating layer on the first conductive layer;
   a second conductive layer on the second insulating layer;
   a pixel capacitor formed of the first conductive layer, the second insulating layer and the second conductive layer;
   a third insulating layer provided on the second conductive layer and including an opening in a region overlapping a part of the second conductive layer as seen in a plan view; and
   an organic layer covering the opening of the third insulating layer and including a light emitting layer,
   wherein
   the first insulating layer includes a first groove in a region overlapping the third insulating layer and not overlapping the opening as seen in a plan view, and
   a part of the pixel capacitor is located inside the first groove.

2. The organic EL display device according to claim 1, wherein a different part of the pixel capacitor is located in a region overlapping the opening as seen in a plan view.

3. The organic EL display device according to claim 2, wherein the different part of the pixel capacitor is a flat plate-like capacitor provided on the first insulating layer.

4. The organic EL display device according to claim 2, wherein
   the first insulating layer includes a second groove in a region overlapping the opening as seen in a plan view, the second groove being separated from the first groove, and
   the different part of the pixel capacitor is located inside the second groove.

5. The organic EL display device according to claim 4, further comprising a fourth insulating layer inside the second groove, the fourth insulating layer flattening the second groove.

6. The organic EL display device according to claim 5, wherein
   the second conductive layer has a stack structure including at least a lower conductive layer and an upper conductive layer, and
   the fourth insulating layer is located between the lower conductive layer and the upper conductive layer of the stack structure.

7. The organic EL display device according to claim 6, wherein
   the upper conductive layer contains silver or a silver alloy, and
   the lower conductive layer contains a light-transmissive metal oxide material.

8. The organic EL display device according to claim 5, wherein the fourth insulating layer is formed of a resin material.

9. The organic EL display device according to claim 1, wherein
   the second conductive layer has a stack structure including at least a lower conductive layer and an upper conductive layer, and
   the lower conductive layer of the stack structure includes a region not overlapping the upper conductive layer of the stack structure as seen in a plan view.

10. The organic EL display device according to claim 9, wherein
    the upper conductive layer contains silver or a silver alloy, and
    the lower conductive layer contains a light-transmissive metal oxide material.

11. The organic EL display device according to claim 1, wherein the first insulating layer and the third insulating layer are formed of a resin material.

12. The organic EL display device according to claim 1, wherein the second insulating layer is formed of an inorganic material.

13. The organic EL display device according to claim 1, wherein the first groove is located along the opening as seen in a plan view.

14. The organic EL display device according to claim 1, wherein
the part of the pixel capacitor located inside the first groove is formed by use of a side surface of the first groove in a depth direction.

15. The organic EL display device according to claim 1, wherein
the second conductive layer is directly in contact with the organic layer in the opening.

16. An organic EL display device, comprising:
a thin film transistor;
a first insulating layer covering the thin film transistor;
a first conductive layer on the first insulating layer;
a second insulating layer on the first conductive layer;
a second conductive layer on the second insulating layer;
a third insulating layer provided on the second conductive layer and including an opening in a region overlapping a part of the second conductive layer as seen in a plan view; and
an organic layer covering the opening of the third insulating layer and including a light emitting layer,
wherein
the first insulating layer includes a first groove in a region overlapping the third insulating layer and not overlapping the opening as seen in a plan view, and
a part of the first conductive layer, a part of the second insulating layer, and a part of the second conductive layer are located inside the first groove.

17. The organic EL display device according to claim 16, wherein
the first insulating layer includes a second groove in a region overlapping the opening as seen in a plan view, the second groove being separated from the first groove, and
a different part of the first conductive layer, a different part of the second insulating layer, and a different part of the second conductive layer are located inside the second groove.

18. The organic EL display device according to claim 16, further comprising a third conductive layer on a surface of the first insulating layer opposite to a surface thereof on which the first conductive layer is provided,
wherein
the first groove exposes a part of the third conductive layer, and
the first conductive layer is in contact with the part of the third conductive layer.

19. The organic EL display device according to claim 16, wherein
the part of the pixel capacitor located inside the first groove is formed by use of a side surface of the first groove in a depth direction.

20. The organic EL display device according to claim 16, wherein
the second conductive layer is directly in contact with the organic layer in the opening.

* * * * *